United States Patent
Hidaka et al.

(10) Patent No.: US 6,862,209 B2
(45) Date of Patent: Mar. 1, 2005

(54) THIN FILM MAGNETIC MEMORY DEVICE WITH MAGNETIC TUNNEL JUNCTION

(75) Inventors: Hideto Hidaka, Hyogo (JP); Masatoshi Ishikawa, Hyogo (JP); Tsukasa Ooishi, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 24 days.

(21) Appl. No.: 10/361,770

(22) Filed: Feb. 11, 2003

(65) Prior Publication Data

US 2004/0042291 A1 Mar. 4, 2004

(30) Foreign Application Priority Data

Sep. 3, 2002 (JP) ........................................ 2002-257857

(51) Int. Cl.[7] .......................... G11C 11/00; G11C 11/14; G11C 11/15
(52) U.S. Cl. ......................... 365/158; 365/171; 365/173
(58) Field of Search ............................... 365/158, 171, 365/173

(56) References Cited

U.S. PATENT DOCUMENTS

| | | | | |
|---|---|---|---|---|
| 6,055,179 A | * | 4/2000 | Koganei et al. | ............. 365/158 |
| 6,522,573 B2 | * | 2/2003 | Saito et al. | ................. 365/158 |
| 6,567,299 B2 | * | 5/2003 | Kunikiyo et al. | ........... 365/173 |
| 6,567,300 B1 | * | 5/2003 | Raberg et al. | .............. 365/173 |
| 6,587,370 B2 | * | 7/2003 | Hirai | ......................... 365/171 |
| 6,621,730 B1 | * | 9/2003 | Lage | ........................... 365/158 |
| 6,625,057 B2 | * | 9/2003 | Iwata | .......................... 365/158 |
| 6,636,436 B2 | * | 10/2003 | Perner | ........................ 365/158 |
| 6,667,526 B2 | * | 12/2003 | Komori | ...................... 365/173 |

FOREIGN PATENT DOCUMENTS

JP          2002-8367          1/2002

OTHER PUBLICATIONS

Scheuerlein et al., "A 10ns Read and Write Non–Volatile Memory Array Using a Magnetic Tunnel Junction and FET Switch in Each Cell." ISSCC Digest of Technical Papers, TA7.2, Feb. 2000, pp 94–95, 128–129, 409–410.

Durlam et al., "Nonvolatile RAM Based on Magnetic Tunnel Junction Elements." ISSCC Digest of Technical Papers, TA7.3, Feb. 2000, pp. 96–97, 130–131, 410–411.

Naji et al., "A 256kb 3.0V 1T1MTJ Nonvolatile Magnetoresistive RAM." ISSCC Digest of Technical Papers, TA7.6, Feb. 2001, pp. 94–95, 122–123, 404–405, 438.

* cited by examiner

Primary Examiner—Trong Phan
(74) Attorney, Agent, or Firm—Burns, Doane, Swecker & Mathis, L.L.P.

(57) ABSTRACT

An access transistor in an MTJ memory cell, which is one of transistors connected to a read current path, is fabricated with a semiconductor layer formed on an insulating film on a semiconductor substrate SUB, and includes impurity regions, a gate region and a body region. That is, the access transistor is fabricated with an SOI (Silicon On Insulator) structure in order to reduce an off-leak current.

23 Claims, 11 Drawing Sheets

THIN FILM MAGNETIC MEMORY DEVICE WITH MAGNETIC TUNNEL JUNCTION

BACKGROUND OF THE INVENTION

1. Field of the Invention

The present invention relates to a thin film magnetic memory device, and more particularly, to a thin film magnetic memory device including a memory cell having a magnetic tunnel junction (MTJ).

2. Description of the Background Art

Recently, an MRAM (Magnetic Random Access Memory) device has attracted attention as a new-generation non-volatile memory device. The MRAM device is a non-volatile memory device storing data in a non-volatile manner with a plurality of thin film magnetic elements formed on a semiconductor integrated circuit, and allowing random access to each thin film magnetic element.

Particularly, it has been disclosed that a performance of the MRAM device is remarkably enhanced by employing a thin film magnetic element using the magnetic tunnel junction as a memory cell in recent days. The MRAM device including the memory cell having the magnetic tunnel junction has been reported in the following references: Roy Scheuerlein et al., "A 10 ns Read and Write Non-Volatile Memory Array Using a Magnetic Tunnel Junction and FET Switch in each Cell", 2000 IEEE ISSCC Digest of Technical Papers, TA7.2; M. Durlam et al., "Nonvolatile RAM based on Magnetic Tunnel Junction Elements", 2000 IEEE ISSCC Digest of Technical Papers, TA7.3; and Peter K. Naji et al., "A 256 kb 3.0V 1T1MTJ Nonvolatile Magnetoresistive RAM", 2001 IEEE ISSCC Digest of Technical Papers, TA7.6.

FIG. 11 is a schematic diagram showing a configuration of the memory cell having the magnetic tunnel junction (hereinafter, simply referred to as an "MTJ memory cell").

Referring to FIG. 11, the MTJ memory cell includes a tunneling magneto-resistance element TMR having an electric resistance variable in accordance with a data level of magnetically written storage data, and an access transistor ATR. Access transistor ATR is connected in series to tunneling magneto-resistance element TMR between a bit line BL and a source voltage line SL. Typically, a field-effect transistor formed on a semiconductor substrate is employed as access transistor ATR.

Provided for the MTJ memory cell are bit line BL and a digit line DL for feeding a data write current in different directions respectively in data write, a read word line RWL for instructing data read, and source voltage line SL for pulling down tunneling magneto-resistance element TMR to ground voltage GND in data read. In data read, in response to turn-on of access transistor ATR, tunneling magneto-resistance element TMR is electrically coupled between source voltage line SL and bit line BL.

FIG. 12 is a conceptual view illustrating a data write operation into the MTJ memory cell.

Referring to FIG. 12, the tunneling magneto-resistance element TMR includes a ferromagnetic material layer FL having a constant, fixed magnetic direction (hereinafter, simply referred to as a "fixed magnetic layer"), and a ferromagnetic material layer VL magnetized in a direction in accordance with an externally applied magnetic field (hereinafter, simply referred to as a "free magnetic layer"). A tunneling barrier (a tunneling film) TB formed with an insulating film is provided between fixed magnetic layer FL and free magnetic layer VL. Free magnetic layer VL is magnetized in a direction identical or opposite to fixed magnetic layer FL, in accordance with a level of the written storage data. These fixed magnetic layer FL, tunneling barrier TB, and free magnetic layer VL form the magnetic tunnel junction.

The electric resistance of tunneling magneto-resistance element TMR varies in accordance with a relative relation in respective magnetic directions of fixed magnetic layer FL and free magnetic layer VL. Specifically, the electric resistance of tunneling magneto-resistance element TMR is set to a minimum value Rmin when the fixed magnetic layer FL is magnetized in a direction identical to (in parallel with) that of free magnetic layer VL, while it is set to a maximum value Rmax when one of the above layers is magnetized in a direction opposite (antiparallel) to the other.

In data write, read word line RWL is inactivated, and access transistor ATR is turned off. In such a state, the data write current for magnetizing free magnetic layer VL flows in a direction in accordance with the level of the write data, respectively through bit line BL and digit line DL.

FIG. 13 is a conceptual view showing a relation of the data write current with the magnetic direction of the tunneling magneto-resistance element in data write.

Referring to FIG. 13, the abscissa H (EA) represents a magnetic field applied in a direction of an easy axis (EA) in free magnetic layer VL within tunneling magneto-resistance element TMR. On the other hand, the ordinate H (HA) represents a magnetic field acting in a direction of a hard axis (HA) in free magnetic layer VL. Magnetic fields H (EA) and H (HA) correspond to respective one of two magnetic fields produced by the current flowing in bit line BL and digit line DL respectively.

In the MTJ memory cell, the fixed magnetic direction of fixed magnetic layer FL extends along the easy axis of free magnetic layer VL, while free magnetic layer VL is magnetized along the easy axis in a direction parallel or anti-parallel (opposite) to fixed magnetic layer FL, in accordance with the level of the storage data ("1" and "0"). The MTJ memory cell can store 1-bit data ("1" and "0"), corresponding to two magnetic directions of free magnetic layer VL.

The magnetic direction of free magnetic layer VL can be rewritten only when the sum of the applied magnetic fields H (EA) and H (HA) reaches a region outside an asteroid property line shown in FIG. 13. In other words, if the applied data write magnetic field has intensity within a region inside the asteroid property line, the magnetic direction of free magnetic layer VL does not vary.

As shown with the asteroid characteristic line, a magnetization threshold value necessary for varying the magnetic direction along the easy axis can be lowered by applying a magnetic field in the direction of hard axis to free magnetic layer VL. When an operation point in data write is designed as in an example shown in FIG. 13, in the MTJ memory cell to which data is to be written, the data write magnetic field in the direction of the easy axis is designed to have an intensity $H_{WR}$. In other words, a value of the data write current fed through bit line BL or digit line DL is designed so as to obtain data write magnetic field $H_{WR}$. Generally, data write magnetic field $H_{WR}$ is shown with the sum of a switching magnetic field $H_{SW}$ necessary for switching the magnetic direction and a margin $\Delta H$. That is, it is shown with $H_{WR}=H_{SW}+\Delta H$.

In order to rewrite the storage data in the MTJ memory cell, that is, the magnetic direction of tunneling magneto-resistance element TMR, the data write current at a prescribed level or higher should be fed through both digit line DL and bit line BL. Thus, free magnetic layer VL in tunneling magneto-resistance element TMR is magnetized in a direction parallel or opposite (antiparallel) to fixed magnetic layer FL in accordance with an orientation of the data write magnetic field along the easy axis (EA). The magnetic direction once written in tunneling magneto-resistance element TMR, that is, the storage data in the MTJ memory cell, is held in a non-volatile manner until new data write is carried out.

FIG. 14 is a conceptual view illustrating a data read operation from the MTJ memory cell.

Referring to FIG. 14, in the data read operation, access transistor ATR turns on in response to activation of read word line RWL. Thus, tunneling magneto-resistance element TMR is electrically coupled to bit line BL while it is pulled down to ground voltage GND.

In such a state, when bit line BL is pulled up to a prescribed voltage, a memory cell current Icell in accordance with the electric resistance of tunneling magneto-resistance element TMR, that is, in accordance with the level of the storage data in the MTJ memory cell, passes through a current path including bit line BL and tunneling magneto-resistance element TMR. For example, by comparing memory cell current Icell with a prescribed reference current, the storage data can be read from the MTJ memory cell.

Here, generally, memory cell current Icell is designed to be lower by 1 to 2 digits than the above-described data write current. Therefore, it is unlikely that the storage data in the MTJ memory cell is inadvertently rewritten due to an effect of memory cell current Icell. In other words, non-destructive data read is possible.

FIG. 15 shows a first configuration example of the MTJ memory cell connected on the semiconductor substrate.

Referring to FIG. 15, access transistor ATR formed on a semiconductor substrate SUB includes impurity regions 110 and 120 which are of n-type, and a gate region 130. Impurity region 110 is electrically coupled to source voltage line SL via a metal film formed in a contact hole 135.

Digit line DL is formed in a metal interconnection layer provided above source voltage line SL. Tunneling magneto-resistance element TMR is disposed on the upper side of digit line DL. Tunneling magneto-resistance element TMR is electrically coupled to impurity region 120 in access transistor ATR via a strap 150 and a metal film formed in a contact hole 140. Strap 150 is provided so as to electrically couple tunneling magneto-resistance element TMR to access transistor ATR, and formed with a conductive material. Bit line BL is electrically coupled to tunneling magneto-resistance element TMR, and provided on the upper side of tunneling magneto-resistance element TMR.

Bit line BL through which the data write current and a read current is fed, and digit line DL through which the data write current is fed are formed with the metal interconnection layer. Meanwhile, since read word line RWL is provided so as to control a gate voltage of access transistor ATR, it is not necessary to actively feed the current. Therefore, in the viewpoint of higher integration, read word line RWL is generally formed in the same interconnection layer as gate region 130, using a polysilicon layer, a polycide layer or the like, without newly providing an independent metal interconnection layer.

FIG. 16 shows a second configuration example of the MTJ memory cell fabricated on the semiconductor substrate.

Referring to FIG. 16, the second configuration example is different in that source voltage line SL is formed without using the metal interconnection layer in order to reduce the number of the metal interconnection layers necessary in the structure of the MTJ memory cell. Impurity regions 110 comparable to the source are electrically coupled to each other between access transistors ATR adjacent in a direction of row or column, and coupled to ground voltage GND, thereby acting as a source voltage line.

Accordingly, digit line DL and bit line BL formed in metal interconnection layers M2 and M3 respectively in the first configuration example shown in FIG. 15 are formed in metal interconnection layers M1 and M2 respectively. Thus, in the second configuration example, the number of metal interconnection layers necessary for forming these signal lines is reduced by one, compared to the first configuration example. Therefore, higher integration of the MTJ memory cell can be achieved.

As described above, the MRAM device can realize non-volatile data storage with the MTJ memory cell integrated and disposed on the semiconductor substrate. In each MTJ memory cell, tunneling magneto-resistance element TMR has an electric resistance variable in accordance with the magnetic direction rewritable by the applied data write magnetic field. Therefore, by associating electric resistance Rmax and Rmin of tunneling magneto-resistance element TMR with the level of the storage data ("1" and "0") respectively, non-volatile data storage can be realized.

As described with reference to FIG. 14, data read in the MRAM device is carried out by detecting as a read current, memory cell current Icell reflecting the electric resistance of a selected memory cell, or another current in accordance with the memory cell current Icell, by a sense amplifier, for example.

A number of transistors that are turned off in data read, however, are connected to such a path for the read current (hereinafter, referred to as a "read current path"). For example, in a configuration in which a word line is disposed corresponding to a memory cell row, while a bit line BL is disposed corresponding to a memory cell column, access transistor ATR not only in the selected memory cell but also in a plurality of non-selected memory cells belonging to an identical memory cell row is connected to a selected bit line contained in the read current path. In these non-selected memory cells, access transistor ATR has been turned off, in response to inactivation of the corresponding word line.

When a leak current produced by a sub-threshold current or a diffusion leak current from a diffusion region is produced in the transistors that have been turned off, the sum of an original read current and the leak current is detected in the sense amplifier. Therefore, as the lead current increases, the read current does not necessarily reflect the electric resistance of the selected memory cell, and a data read margin may be deteriorated.

Particularly, in a general MTJ memory cell, a value for the electric resistance is of the order of several tens KΩ, and the voltage applied to the MTJ memory cell in data read is suppressed approximately to 0.5V, considering reliability and the like of the tunneling film (insulating film). Therefore, the above read current remains at the order of micro ampere ($\mu A$: $10^{-6}A$), and a read current difference in accordance with the storage data in the selected memory cell is only of the order of several $\mu A$. Accordingly, in order to secure the read margin, the leak current should be suppressed.

SUMMARY OF THE INVENTION

An object of the present invention is to provide a thin film magnetic memory device having a higher read margin by suppressing a leak current produced in a read current path.

A thin film magnetic memory device according to the present invention includes: a plurality of magnetic memory cells arranged in matrix, and including a magneto-resistance element each having an electric resistance variable in accordance with magnetically written storage data; a data line through which a read current is fed in data read, in accordance with the storage data of a selected memory cell corresponding to an address signal among the plurality of magnetic memory cells; and a peripheral circuit for carrying out data read and data write for the selected memory cell. The peripheral circuit includes a sense amplifier circuit reading the storage data in the selected memory cell based on the read current. At least some of transistors electrically coupled to a current path of the read current are designed to have an amount of current leak per a unit size smaller than at least some transistors having a maximum amount of current leak per a unit size among transistors in the peripheral circuit.

A thin film magnetic memory device according to another configuration of the present invention includes: a plurality of magnetic memory cells arranged in matrix, and including a magneto-resistance element each having an electric resistance variable in accordance with magnetically written storage data; a data line through which a read current is fed in accordance with the storage data in a selected memory cell corresponding to an address signal, among the plurality of magnetic memory cells in data read; and a peripheral circuit for carrying out data read and data write for the selected memory cell. The peripheral circuit includes a sense amplifier circuit reading the storage data in the selected memory cell based on the read current. At least some of transistors electrically coupled to a current path for the read current have an SOI structure.

Therefore, a primary advantage of the present invention is that the leak current in turn-off in transistors connected to the path for the read current can be suppressed in the thin film magnetic memory device. Accordingly, as the read current, or the voltage produced by the read current, can accurately reflect the electric resistance, that is, the storage data, of the selected memory cell, the data read margin can be secured.

A thin film magnetic memory device according to another configuration of the present invention includes: a plurality of magnetic memory cells arranged in matrix, and including a magneto-resistance element each having an electric resistance variable in accordance with magnetically written storage data; a plurality of write current lines selectively generating a data write magnetic field applied to a selected memory cell corresponding to an address signal among the plurality of magnetic memory cells; and a peripheral circuit for carrying out data read and data write for the selected memory cell. The peripheral circuit includes a plurality of write driver transistors provided corresponding to the plurality of write current lines respectively, and supplying a data write current to corresponding one of the current write lines. Each write driver transistor is designed to have an amount of current leak per a unit size smaller than at least some transistors having a maximum amount of current leak per a unit size among transistors in the peripheral circuit.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
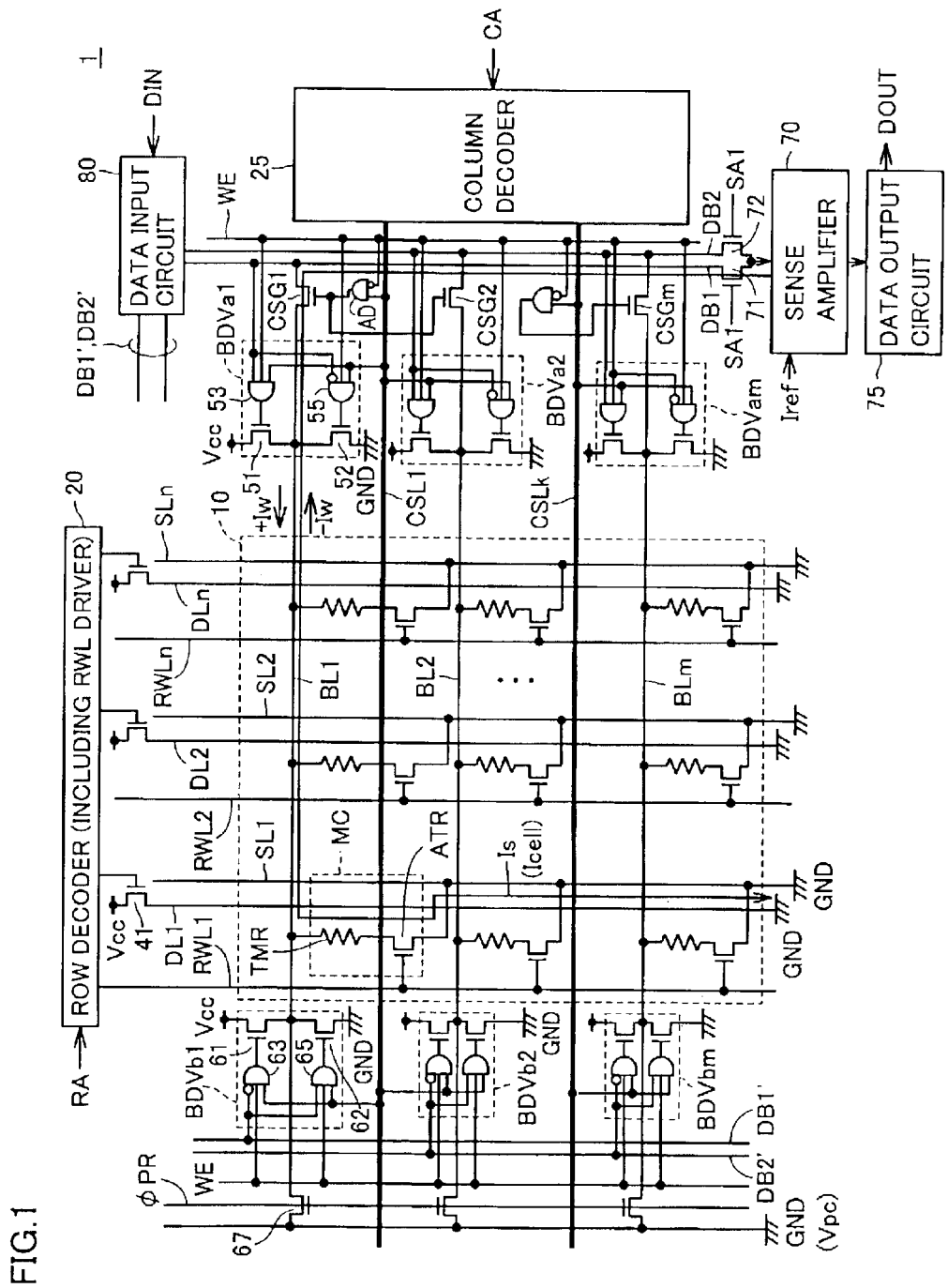
FIG. 1 is a circuit diagram showing an array configuration of an MRAM device according to a first embodiment of the present invention.

In the following, embodiments of the present invention will be described in detail with reference to the figures. It is noted that the same reference characters refer to the same or corresponding components in the figures.

First Embodiment

Referring to FIG. 1, an MRAM device 1 according to the first embodiment includes a memory cell array 10 formed with a plurality of MTJ memory cells MC arranged in n rows and m columns (n, m: a natural number), a row decoder 20 performing row select in memory cell array 10 based on a row address RA, and a column decoder 25 performing column select in memory cell array 10 based on a column address CA.

In memory cell array 10, read word lines RWL1–RWLn, digit lines DL1–DLn, and source voltage lines SL1–SLn are disposed corresponding to a memory cell row respectively, and bit lines BL1–BLm are provided corresponding to a memory cell column respectively. In the following, read word lines RWL1–RWLn, digit lines DL1–DLn, bit lines BL1–BLm, and source voltage lines SL1–SLn are collectively denoted as read word line RWL, digit line DL, bit line BL, and source voltage line SL, respectively. In addition, binary states, that is, a high voltage state (power supply voltage Vcc, for example) and a low voltage state (ground voltage GND, for example) of a signal, a signal line and data are referred to as "H level" and "L level" respectively.

Figure 11:
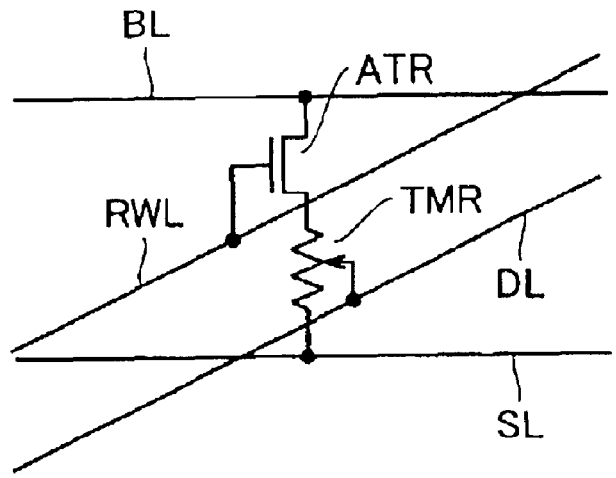
FIG. 11 is a schematic diagram showing a configuration of an MTJ memory cell.
Figure 12:
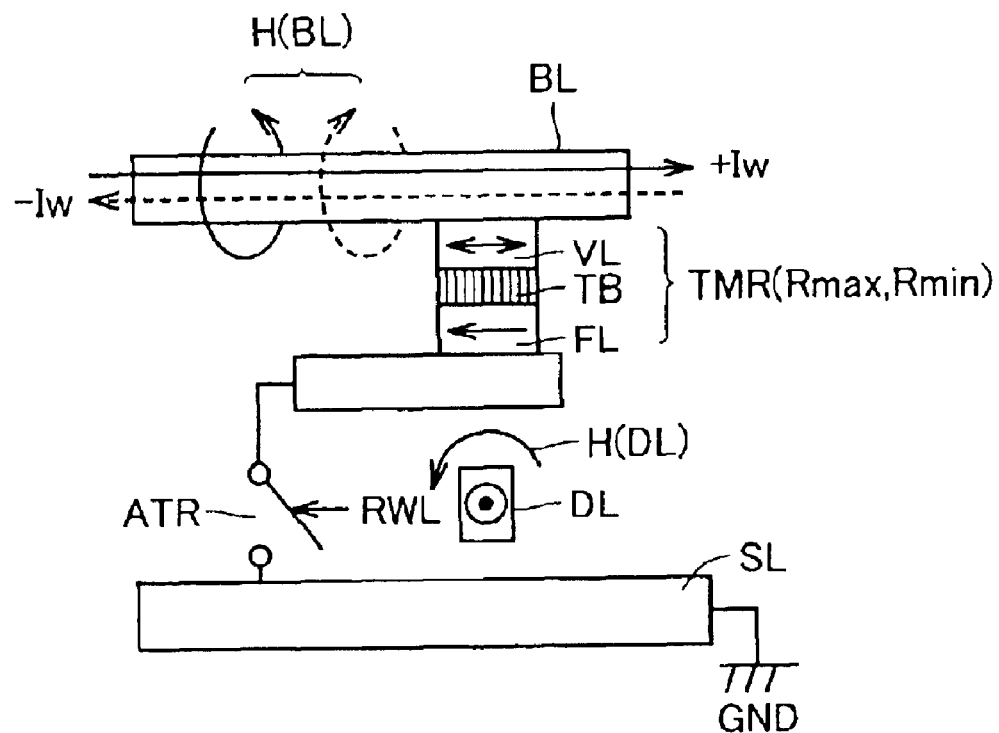
FIG. 12 is a conceptual view illustrating a data write operation to the MTJ memory cell.
Figure 13:
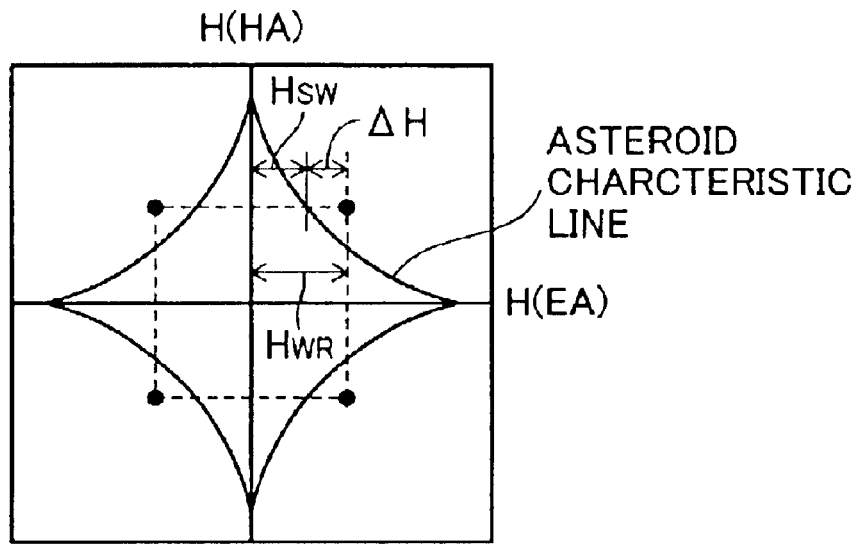
FIG. 13 is a conceptual view showing a relation of a data write current with a magnetic direction of a tunneling magneto-resistance element in data write.
Figure 14:
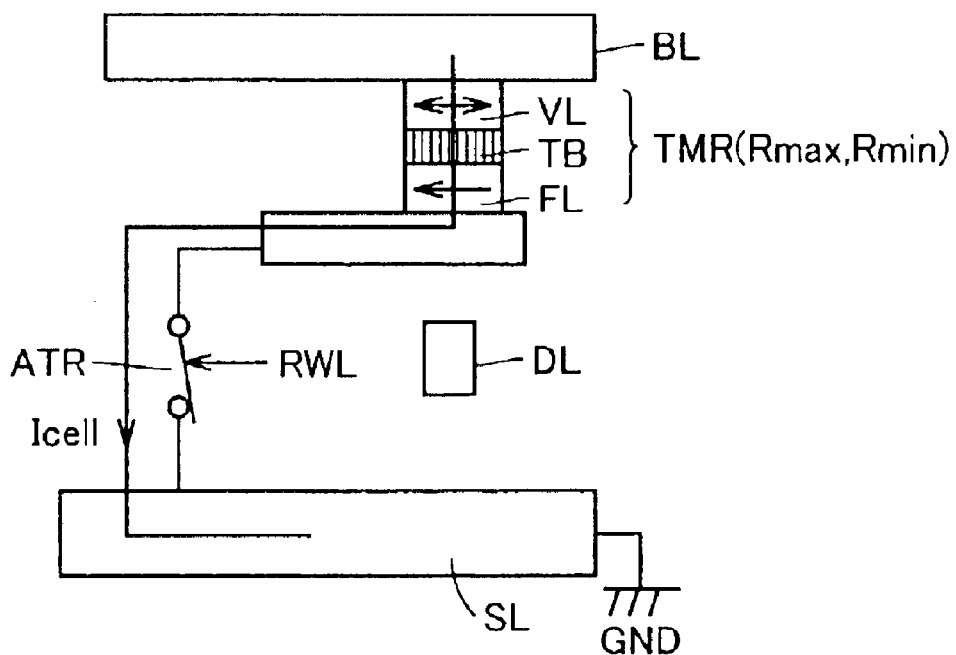
FIG. 14 is a conceptual view illustrating a data read operation from the MTJ memory cell.

Each MTJ memory cell MC is configured in the same manner as shown in FIG. 11, and includes tunneling magneto-resistance element TMR and access transistor ATR connected in series between corresponding bit line BL and source voltage line SL. Access transistor ATR has the gate connected to corresponding read word line RWL. Access transistor ATR has the source supplied with ground voltage GND by corresponding source voltage line SL. Tunneling magneto-resistance element TMR is magnetized in a direction in accordance with the storage data, and has electric resistance of either Rmax or Rmin.

To be strict, the electric resistance of each MTJ memory cell is the sum of on-resistance of tunneling magneto-resistance element TMR and access transistor ATR, and other parasitic resistance. The resistance other than that of tunneling magneto-resistance element TMR, however, is constant regardless of the storage data. Therefore, in the following, two types of electric resistance of MTJ memory cell MC in accordance with the storage data are represented as Rmax and Rmin, and the difference therebetween is represented as ΔR (that is, ΔR=Rmax−Rmin).

Next, a configuration in a periphery of memory cell array 10 will be described.

MRAM device 1 further includes a digit line driver transistor 41 provided between power supply voltage Vcc and one end of digit line DL. Digit line driver transistor 41 is constituted with an N-channel MOS transistor, for example. A decode signal activated to H level when a corresponding memory cell row is selected as a data write target in data write is provided from row decoder 20 to the gate of digit line driver transistor 41.

Therefore, digit line DL in the selected row has its one end connected to power supply voltage Vcc and the other end connected to ground voltage GND respectively, in response to turn-on of digit line driver transistor 41. Consequently, the data write current in a prescribed direction from power supply voltage Vcc to ground voltage GND can flow through the digit line in the selected row. On the other hand, in data read, digit line driver transistor 41 is turned off in each memory cell row, and the current does not flow in each digit line DL.

Row decoder 20, in data read, activates read word line RWL in the selected row to H level based on row address RA, and inactivates read word line RWL in a non-selected row to L level. Row decoder 20 is assumed to include a not-shown RWL driver. Meanwhile, in data write, each read word line RWL is inactivated to L level.

MRAM device 1 further includes a plurality of data buses DB1 and DB2 as well as DB1' and DB2' provided in a region adjacent to memory cell array 10. Data buses DB1 and DB2 are disposed in a region opposite to data buses DB1' and DB2', with memory cell array 10 interposed.

MRAM device 1 further includes column select gate transistors CSG1–CSGm, and bit line drivers BDVa1–BDVam and BDVb1–BDVbm, provided corresponding to memory cell columns (that is, bit lines BL1–BLm) respectively. In the following, column select gate transistors CSG1–CSGm, and bit line drivers BDVa1–BDVam and BDVb1–BDVbm are collectively referred to as a column select gate transistor CSG and bit line drivers BDVa, BDVb, respectively.

Bit line BL is connected to a prescribed one of data buses DB1 and DB2 via corresponding column select gate transistor CSG. In FIG. 1, a configuration is shown, in which an odd-numbered bit line is associated with data bus DB1, while an even-numbered bit line is associated with data bus DB2. For example, bit line BL1 is connected to data bus DB1 via column select gate transistor CSG1, while bit line BL2 is connected to data bus DB2 via column select gate transistor CSG2.

MRAM device 1 further includes k (k: natural number) column select lines CSL1–CSLk. Here, the number thereof is determined in accordance with the number of data buses. In the configuration shown in FIG. 1, two data buses DB1 and DB2 are used for carrying out data read. Therefore, k=m/2.

Column decoder 25, in accordance with a decode result of column address CA, that is, a column select result, activates one of column select lines CSL1–CSLk, that corresponds to the column select result, to a select state (H level). In the following, column select lines CSL1–CSLk are collectively referred to as a column select line CSL.

Each column select gate transistor CSG has the gate connected to a prescribed column select line CSL. One column select line CSL is electrically coupled to the gates of a plurality of column select gate transistors connected to different data buses respectively. For example, column select gate transistors CSG1 and CSG2 connected to data buses DB1 and DB2 respectively are connected to column select line CSL1 common to each gate.

Each of bit line drivers BDVa1–BDVam provided corresponding to bit lines BL1–BLm has the same configuration, and bit line drivers BDVb1–BDVbm are of the same configuration. Therefore, configurations of bit line drivers BDVa1, BDVb1 will be described as a representative.

Bit line driver BDVa1 includes a bit line driver transistor 51 connected between power supply voltage Vcc and the side of one end of bit line BL1 (column decoder 25 side), a bit line driver transistor 52 connected between the side of one end of bit line BL1 and ground voltage GND, and logic gates 53 and 55 for controlling gate voltages of bit line driver transistors 51 and 52 respectively.

Logic gate 53 outputs to the gate of bit line driver transistor 51, an AND logical operation result among three voltage levels of data bus DB1, a control signal WE set to H level in data write, and column select line CSL1. Logic gate 55 outputs to the gate of bit line driver transistor 52, an AND logical operation result among three voltage levels of the inverted level of data bus DB1, control signal WE, and column select line CSL1.

In contrast, bit line driver BDVb1 includes a bit line driver transistor 61 connected between power supply voltage Vcc and the side of the other end of bit line BL1 (a side opposite to column decoder 25), a bit line driver transistor 62 connected between the side of the other end of bit line BL1 and ground voltage GND, and logic gates 63 and 65 for controlling gate voltages of bit line driver transistors 61 and 62 respectively.

In order to supply a sufficient write current even with a small transistor size, bit line driver transistors 51, 52, 61, 62 are constituted, for example, with an N-channel type MOS transistor having a relatively large current drivability.

Logic gate 63 outputs to the gate of bit line driver transistor 61, an AND logical operation result among three voltage levels of the inverted level of data bus DB1', control signal WE, and column select line CSL1. Logic gate 65 outputs to the gate of bit line driver transistor 62, an AND logical operation result among three voltage levels of data bus DB1', control signal WE, and column select line CSL1.

MRAM device 1 further includes a data input circuit 80. Data input circuit 80 has an input buffer function, and drives voltages of data buses DB1, DB2 and DB1', DB2' in accordance with input data DIN externally provided. Using a pair of data buses DB1 and DB1' and a pair of data buses DB2 and DB2', data write by one bit is carried out in respective pairs.

For example, when the write data is at H level ("1"), data bus DB1 or DB1' is driven to H level (power supply voltage Vcc), and data bus DB2 or DB2' is driven to L level (ground voltage GND). In contrast, when the write data is at L level ("0"), data bus DB1 or DB1' is driven to L level (ground voltage GND), and data bus DB2 or DB2' is driven to H level (power supply voltage Vcc).

Thus, in writing the H level data (DIN="1"), a data write current +Iw flows through bit line BL in the selected column in a direction from bit line driver BDVa toward BDVb. In writing the L level data (DIN="0"), a data write current −Iw flows through bit line BL in the selected column in a direction opposite to that in writing the H level data, that is, a direction from bit line driver BDVb toward BDVa.

The data write current flowing through digit line DL generates a magnetic field extending along the direction of the hard axis in MTJ memory cell MC. On the other hand, the data write current flowing through the bit line in a direction in accordance with the write data generates a magnetic field extending along the direction of the easy axis in MTJ memory cell MC. The write data in accordance with a direction of the data write current flowing in the bit line is magnetically written in memory cell MC in which the data write current is fed through both of corresponding digit line DL and bit line BL.

In MRAM device 1, 2-bit data write is carried out in parallel, using two bit lines (an even-numbered column and an odd-numbered column) corresponding to an identical column select line CSL. For example, when column select line CSL1 is selected, a data write current in accordance with a voltage setting of data buses DB1 and DB1' is fed in bit line BL1, while a data write current in accordance with a voltage setting of data buses DB2 and DB2' is fed in bit line BL2. Therefore, the data write is carried out in parallel with respect to two selected memory cells corresponding to bit lines BL1 and BL2 respectively.

MRAM device 1 further includes a precharge transistor 67 provided corresponding to each bit line BL, a sense amplifier circuit 70, sense select gate transistors 71, 72, and a data output circuit 75.

Precharge transistor 67 is electrically coupled between a precharge voltage Vpc and each bit line BL. Precharge transistor 67 turns on in response to a precharge signal φPR. For example, ground voltage GND can be used as precharge voltage Vpc.

Precharge signal φPR is activated for precharging each bit line BL, for example, before and after the data write and data read operation during a stand-by period and an active period of MRAM device 1. On the other hand, in the data write and data read operation during the active period of the MRAM device, precharge signal φPR is inactivated to L level. In response to this, each bit line BL is disconnected from precharge voltage Vpc (ground voltage GND).

Sense select gate transistors 71 and 72 are connected between data buses DB1, DB2 and sense amplifier circuit 70 respectively. Sense select signals SA1 and SA2 selectively set to H level in data read are input to the gates of sense select gate transistors 71 and 72 respectively. Sense select gate transistors 71 and 72 are constituted with an N-channel MOS transistor, for example. Therefore, in data read, one of sense select gate transistors 71 and 72 turns on, and one of data buses DB1 and DB2 is connected to sense amplifier circuit 70.

Moreover, in data read, read word line RWL in a selected row and column select line CSL corresponding to a selected column are activated. Consequently, the following read current path is formed: sense amplifier circuit 70—sense select gate transistor (71 or 72)—selected data bus (DB1 or DB2)—column select gate transistor CSG—selected bit line—tunneling magneto-resistance element TMR—access transistor ATR—source voltage line SL—ground voltage GND. Through this path, a read current Is in accordance with the electric resistance of the selected memory cell (that is, the storage data) is fed.

In this configuration, read current Is is comparable to memory cell current Icell passing through the selected memory cell, and is designed to attain Is (Rmax) or Is (Rmin) respectively when the electric resistance of the selected memory cell is Rmax or Rmin. Reference current Iref is a constant current designed to attain a median value between Is (Rmax) and Is (Rmin) described above. Here, in the configuration as shown in FIG. 1, a plurality of data buses DB1 and DB2 are selectively used for data read. Therefore, the number of column select gate transistors CSG in a turn-off state, connected to the read current path, is reduced, compared to the configuration in which bit lines BL1 to BLm are connected to one data bus.

Data output circuit 75 has an output buffer function, and outputs read data generated by sense amplifier circuit 70 as output data DOUT to the outside.

A data write and data read operation in the MRAM device described above will be discussed with reference to FIGS. 2 and 3.

Figure 2:
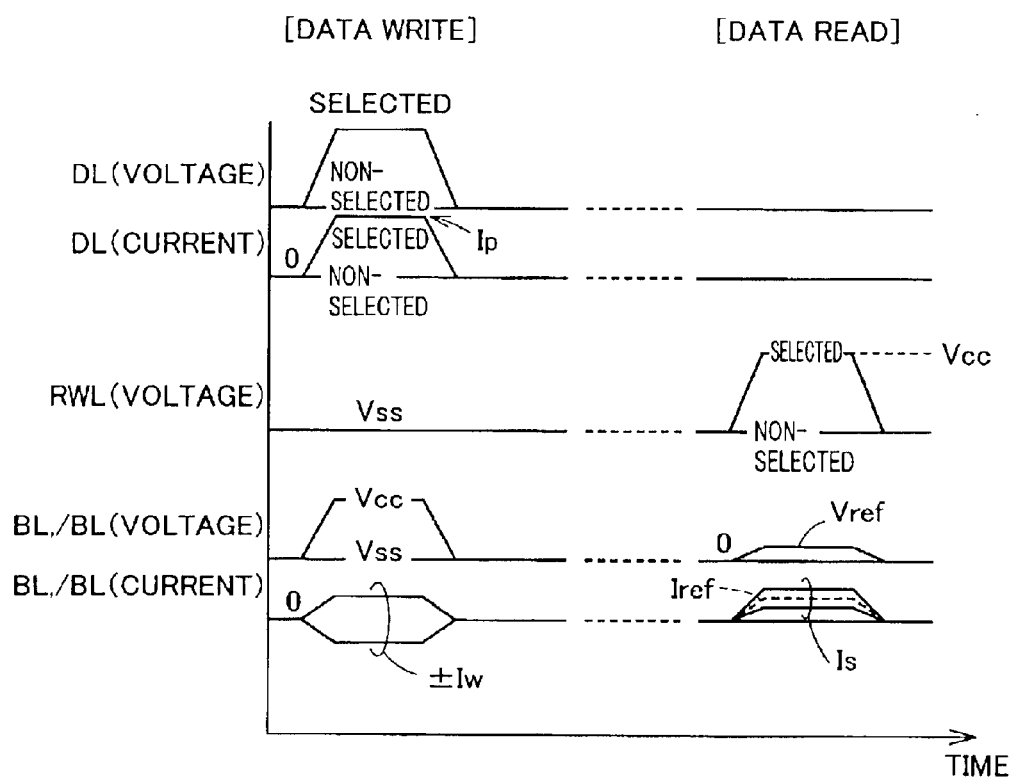
FIG. 2 is a first waveform diagram illustrating a data write and data read operation in the MRAM device shown in FIG. 1.

Referring to FIG. 2, in data write, each read word line RWL is inactivated to L level (ground voltage GND), and digit line DL in the selected row is activated. In addition, though not shown, column select line CSL in the selected column is activated.

Accordingly, a data write current Ip in a constant direction and a data write current ±Iw in a direction in accordance with the write data are supplied respectively to digit line DL in the selected row and bit line BL in the selected column. Here, data write currents +Iw and −Iw in different directions are collectively referred to as data write current ±Iw. Consequently, data write is carried out with respect to the selected memory cell positioned at an intersection of the digit line in the selected row and the bit line in the selected column.

In data read, read word line RWL corresponding to the selected row is activated to H level, while each digit line DL is inactivated, and no current flows therein. In addition, though not shown, column select line CSL in the selected column is activated.

Bit line BL in the selected column is pulled down to ground voltage GND via the selected memory cell. Sense amplifier circuit 70 connects bit line BL in the selected column to a prescribed voltage Vref, which is different from ground voltage GND, via data bus DB1 or DB2. Generally, prescribed voltage Vref is set approximately to 0.5V, considering properties of tunneling magneto-resistance element TMR, for example, reliability of the tunneling film, and an appearance of a junction resistance difference ΔR (=Rmax−Rmin).

Here, read current Is in accordance with the storage data in the selected memory cell flows through the read current path including a bit in the selected column. By detecting the current difference between read current Is and the aforementioned reference current Iref, the storage data in the selected memory cell can be read. Since a general configuration for amplifying and detecting the current difference is applicable to sense amplifier circuit 70, description for detailed circuit configuration thereof will not be provided.

Figure 3:
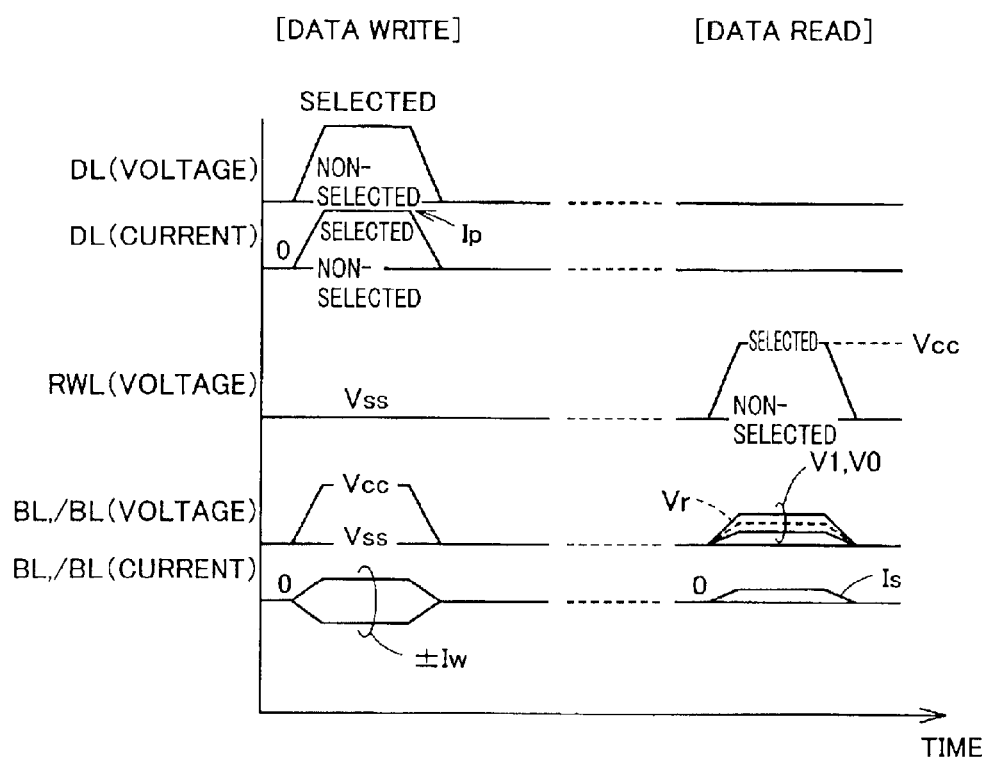
FIG. 3 is a second waveform diagram illustrating the data write and data read operation in the MRAM device shown in FIG. 2.

FIG. 3 shows a variation of the data read operation. In the data read operation shown in FIG. 3, sense amplifier circuit 70 supplies a constant read current Is to bit line BL in the selected column via data bus DB1 or DB2. In response to this, a voltage V1 or V0 in accordance with two electric resistances (Rmax, Rmin) of the selected memory cell is generated in bit line BL in the selected column based on read current Is.

Therefore, by detecting the voltage difference between a prescribed voltage Vr designed corresponding to an intermediate level of the aforementioned voltages V1 and V0 and the voltage of data bus DB1 or DB2 connected to the selected bit line, the storage data in the selected memory cell can be read. Here, since a general configuration for amplifying and detecting the current difference is applicable to sense amplifier circuit 70 used for such a data read operation, description for the detailed circuit configuration thereof will not be provided. In addition, as the data write operation shown in FIG. 3 is the same as in FIG. 2, description thereof will not be repeated.

Any data read operation in FIGS. 2 and 3 is performed based on read current Is that flows through the read current path. Therefore, if an effect of the leak current on the read current is more significant, the data read margin will be lowered.

For example, in the non-selected memory cell on the selected bit line, a junction leak current between tunneling magneto-resistance element TMR and access transistor ATR, and a channel leak current running through a channel in access transistor ATR to ground voltage GND, or a gate leak current produced in access transistor will be a cause for such a leak current. In addition, a leak current of a similar type may also be produced in column select gate transistor CSG that has been turned off, and bit line driver transistors 51, 52, 61, 62.

Next, a configuration for suppressing an off-leak current from the read current path will be described.

Figure 4:
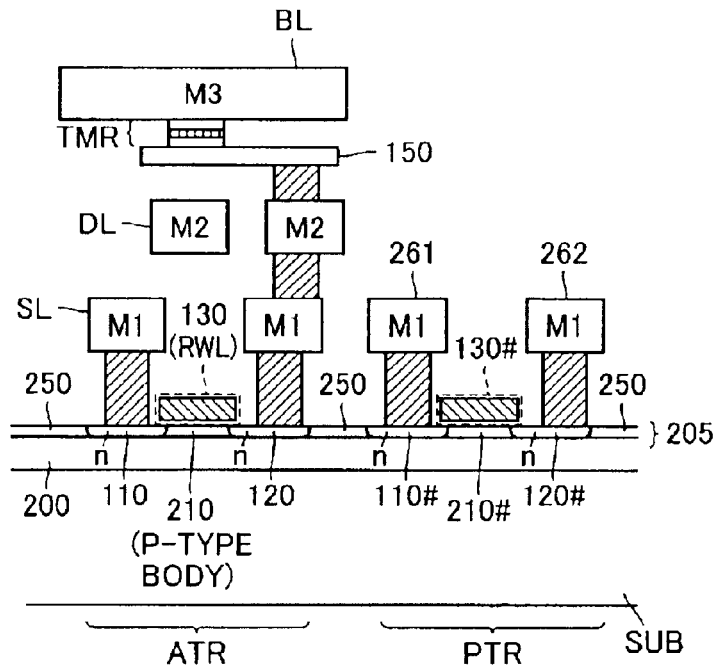
FIG. 4 is a cross-sectional view showing a configuration example of transistors connected to a read current path, according to the first embodiment.

FIG. 4 is a cross-sectional view showing a configuration example of the transistors connected to the read current path, according to the first embodiment.

Referring to FIG. 4, at least some of access transistor ATR and peripheral circuit transistor PTR contained in transistors connected to the read current path are fabricated with an SOI (Silicon On Insulator) structure as shown in FIG. 4. That is, they are fabricated with a semiconductor layer formed on an insulating film. Peripheral circuit transistor PTR is comparable, for example, to column select gate transistor CSG, bit line driver transistors 51, 52, 61, 62, and sense select gate transistors 71, 72 in FIG. 1.

Access transistor ATR and peripheral circuit transistor PTR are fabricated with a semiconductor layer 205 formed on an insulator layer 200 provided on semiconductor substrate SUB. Regions corresponding to different transistors on semiconductor layer 205 are electrically isolated by an insulating film 250.

Figure 15:
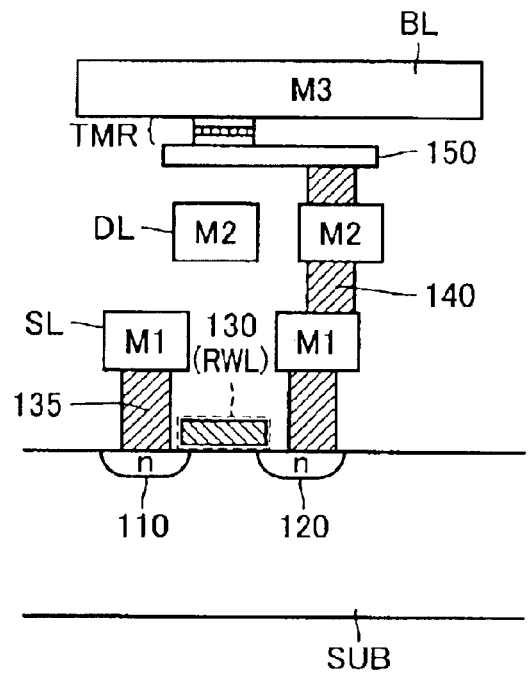
FIG. 15 shows a first configuration example of the MTJ memory cell connected on a semiconductor substrate.

Access transistor ATR includes impurity regions 110, 120 (n-type regions) comparable to a source and drain fabricated on semiconductor layer 205, and a body region 210 (p-type). Gate region 130 comparable to read word line RWL is formed on the upper surface of such a body region 210 via a gate insulating film. As a connection relation of signal line group with tunneling magneto-resistance element TMR in an upper region of access transistor ATR is as shown in FIG. 15, detailed description thereof will not be repeated.

Similarly, peripheral circuit transistor PTR includes impurity regions 110#, 120# (n-type regions) comparable to a source and drain fabricated on semiconductor layer 205 formed on insulator layer 200, a body region 210# (p-type), and a gate region 130# formed on the upper surface of body region 210# via the gate insulating film. In order to attain a prescribed connection relation shown in FIG. 1, metal interconnections 261 and 262 connected to impurity regions 110# and 120# respectively and a gate interconnection formed in gate region 130# are electrically coupled to a desired node.

Thus, by fabricating at least some of transistors connected to the read current path with an SOI structure, the leak current in the transistors connected to the read current path in turn-off can be suppressed. As a result, according to the prescribed design, the read current, or the voltage produced in the selected bit line by the read current, accurately reflects the storage data (electric resistance) in the selected memory cell. Therefore, the data read margin can be secured.

Figure 5:
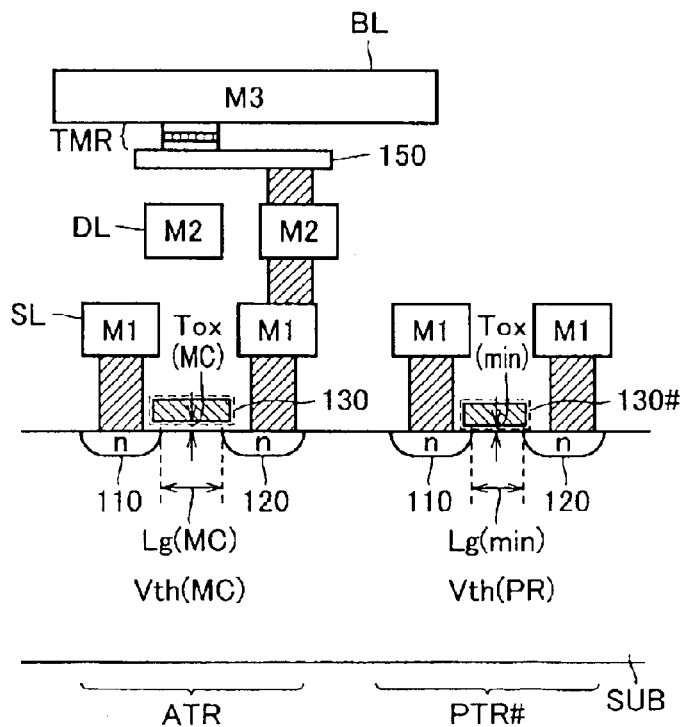
FIG. 5 is a first diagram showing a setting of a design parameter in the transistors connected to the read current path, according to the first embodiment.

FIG. 5 is a first diagram showing a setting of a design parameter in the transistors connected to the read current path, according to the first embodiment.

Referring to FIG. 5, a threshold voltage Vth (MC), a gate length Lg (MC), and a thickness of the gate insulating film Tox (MC) of access transistor ATR are designed, considering parameters of a similar type for peripheral circuit transistor PTR# designed so as to give priority to high-speed operation than suppression of the off-leak current, among transistors constituting the peripheral circuit. Peripheral circuit transistor PTR# shown in FIG. 5 is comparable to transistors constituting row decoder 20, column decoder 25, data input circuit 80, and data output circuit 75 in FIG. 2, for example.

The threshold voltage of peripheral circuit transistor PTR# is represented as Vth (PR), and the gate length and the thickness of the gate insulating film thereof are represented as LG (min) and Tox (min) respectively. In other words, peripheral circuit transistor PTR# collectively represents a transistor having a minimum gate length LG (min), a transistor having a minimum thickness of the gate insulating film Tox (min), and a transistor having a minimum absolute value of the threshold voltage Vth (PR), among the transistors constituting the peripheral circuit. That is, peripheral circuit transistor PTR# collectively represents a transistor having a maximum amount of current leak per a unit size as well.

In order to suppress the off-leak current via a channel in the non-selected memory cell on the selected bit line in access transistor ATR, not only the SOI structure shown in FIG. 4 is adopted, but also gate length Lg (MC) is extended to suppress the channel off-leak current, as well as the thickness of the gate insulating film Tox (MC) is made larger to suppress the gate leak current. Therefore, in access transistor ATR, the gate length is designed to satisfy a relation of Lg (MC)>Lg (min), while the thickness of the gate insulating film is designed to satisfy a relation of Tox (MC)>Tox (min).

In addition, designing the absolute value for the threshold voltage to satisfy a relation of Vth (MC)>Vth (PR) is also effective for suppressing the channel leak current. The threshold voltage can be designed to a different level, by adjusting an impurity density implanted onto the substrate of the transistor and the thickness of the gate insulating film. As a result, the amount of current leak per a unit size of access transistor ATR is made smaller than that of peripheral circuit transistor PTR#.

Figure 6:
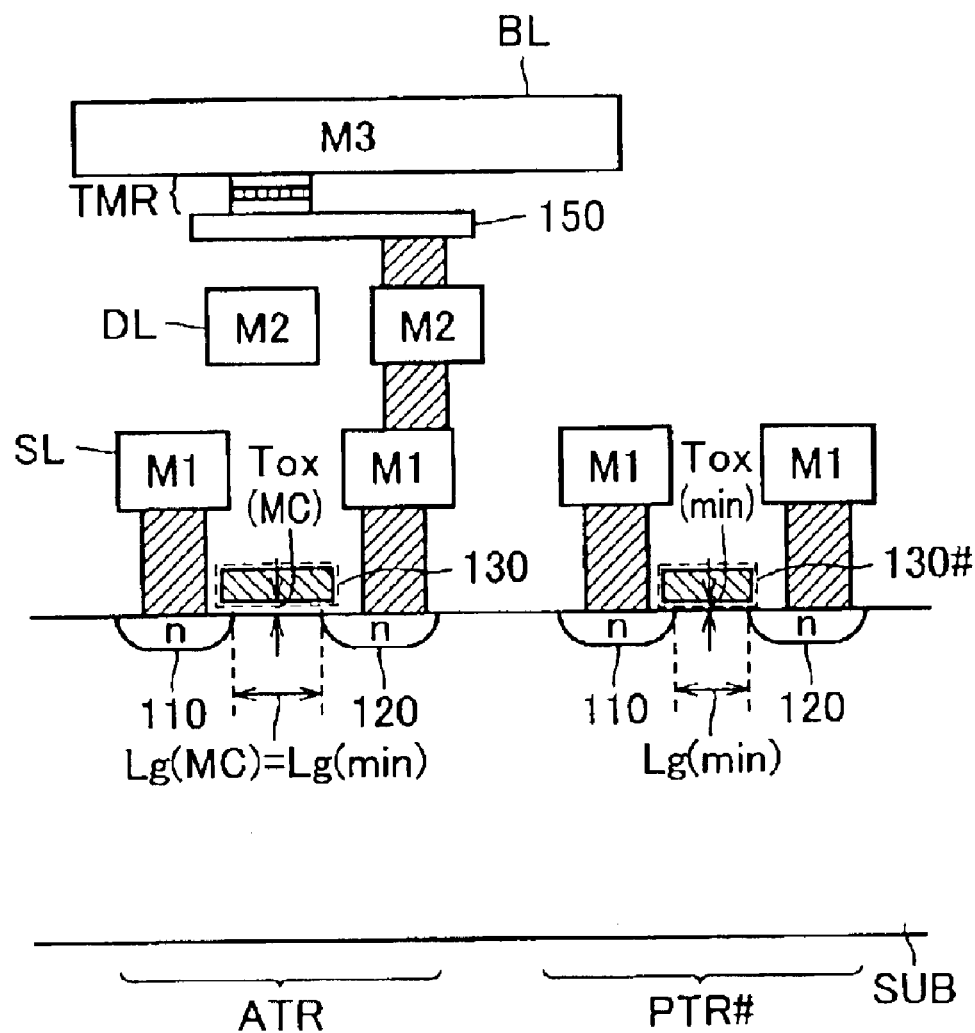
FIG. 6 is a second diagram showing a setting of the design parameter in the transistors connected to the read current path, according to the first embodiment.

FIG. 6 also shows a setting of a design parameter for suppressing the gate leak current in the transistors connected to the read current path.

Referring to FIG. 6, the gate leak current produced between gate region 130 and the body region is more significant as gate length Lg (MC) is longer. In other words, as described with reference to FIG. 5, when the gate length Lg (MC) is extended, the gate leak current increases, though the channel leak current is effectively suppressed. Therefore, if an effect of the gate leak current is more significant, the total leak current can be suppressed by designing the gate length of access transistor ATR so as to achieve a relation of Lg (MC)=Lg (min).

In other words, the gate length Lg (MC) of access transistor ATR should be designed, taking in account whether the channel leak or the gate leak has more significant effect.

Here, the design of the threshold voltage, gate length and thickness of the gate insulating film is also applicable to transistors other than access transistor ATR connected to the read current path, that is, to peripheral circuit transistor PTR shown in FIG. 4.

Thus, according to the configuration of the first embodiment, the leak current in the transistors in a turn-off state connected to the read current path can be suppressed, and the data read margin can be secured.

Figure 16:
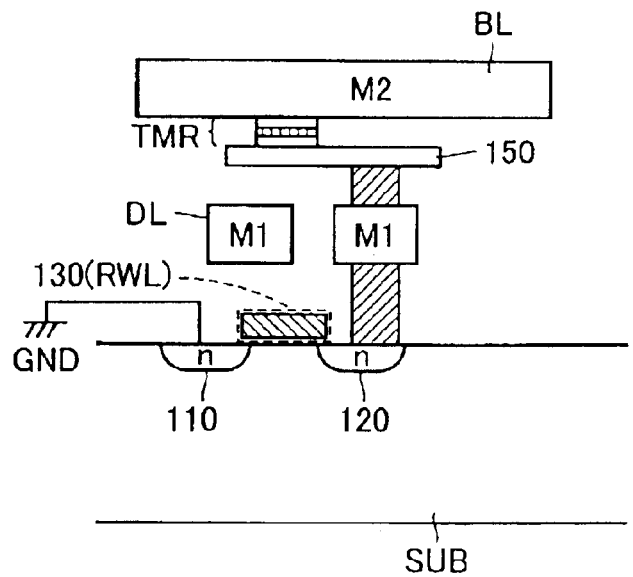
FIG. 16 is a second configuration example of the MTJ memory cell connected on the semiconductor substrate.

In access transistor ATR shown in FIGS. 4 to 6, impurity region 110 can be formed extending in a direction of row so as to act as a source voltage line SL, as in the configuration shown in FIG. 16.

Variation of First Embodiment

Figure 7:
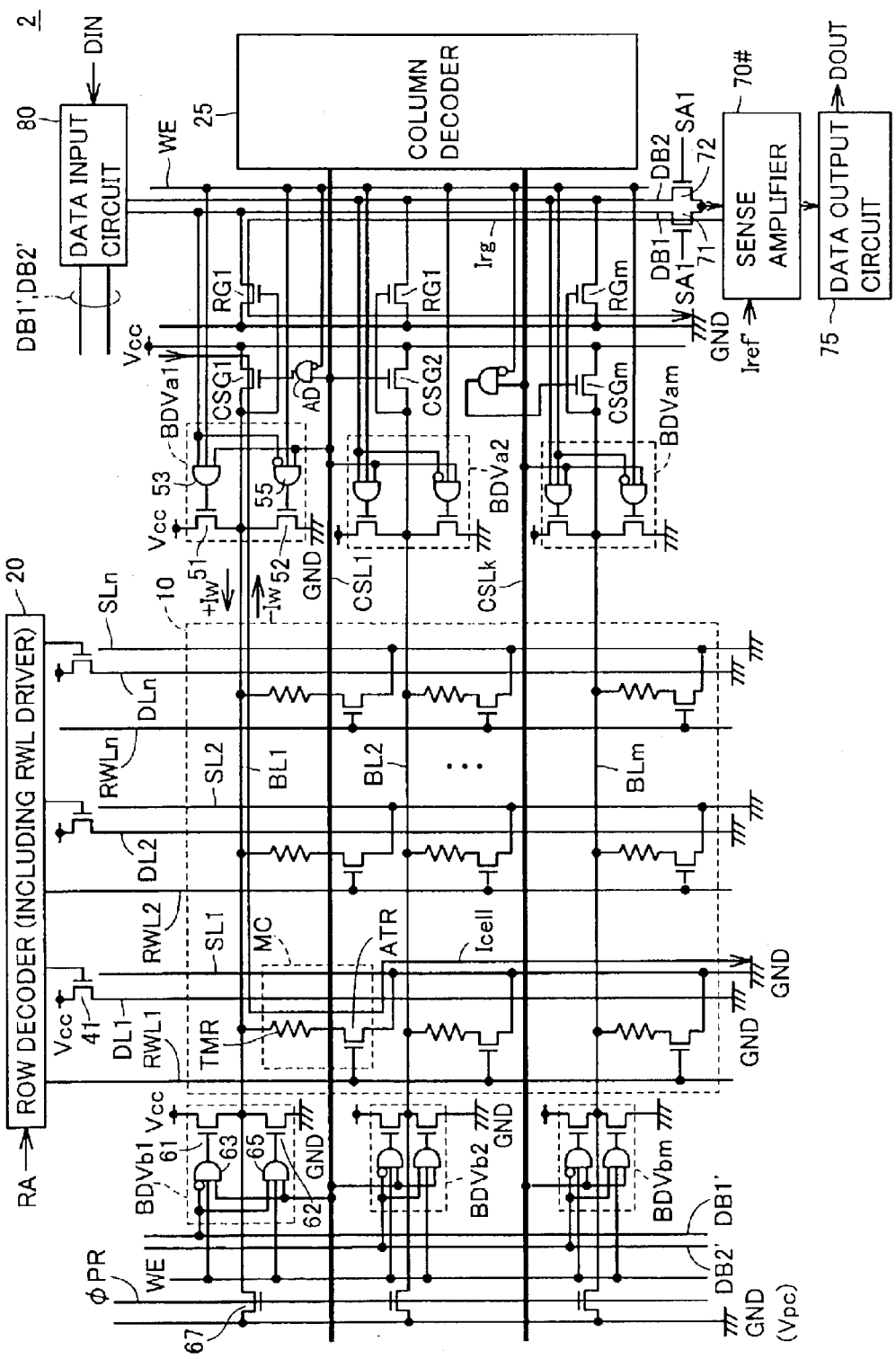
FIG. 7 is a circuit diagram showing an array configuration of an MRAM device according to a variation of the first embodiment.

Referring to FIG. 7, an MRAM device 2 according to a variation of the first embodiment is different from MRAM device 1 according to the first embodiment shown in FIG. 1 in that it further includes read gate transistors RG1–RGm, and has a different connection configuration of bit line BL with data buses DB1 and DB2.

In the configuration according to the variation of the first embodiment, column select gate transistors CSG1–CSGm are electrically coupled between corresponding bit lines BL1–BLm and power supply voltage Vcc. Since on/off of column select gate transistors CSG1–CSGm is controlled in a manner similar to FIG. 1, detailed description thereof will not be repeated.

Read gate transistors RG1–RGm are electrically coupled between a prescribed one of data buses DB1 and DB2 and ground voltage GND, and the gates thereof are connected to bit lines BL1–BLm respectively. In the following, read gate transistors RG1–RGm are collectively referred to as a read gate transistor RG.

With such a configuration, in data read, the selected bit line is pulled up to power supply voltage Vcc via corresponding column select gate transistor CSG, while it is pulled down to ground voltage GND via the selected memory cell. Therefore, a potential in accordance with the electric resistance (that is, the storage data) of the selected memory cell is generated in the selected bit line. The read gate transistor in the selected memory cell column drives a prescribed one of data buses DB1 and DB2 to ground voltage GND with a driving power in accordance with the potential of the selected bit line.

Therefore, by comparing the current difference between the passing current through data buses DB1 and DB2 and a prescribed reference current Iref, using sense amplifier circuit 70#, data read described in the first embodiment can be performed.

Alternatively, when the data read operation is started after precharge to a prescribed voltage for each of data buses DB1 and DB2, voltage of data buses DB1 and DB2 will vary in accordance with the storage data in the selected memory cell. Therefore, data read from the selected memory cell can be carried out also by detecting the voltage of one data bus corresponding to the selected memory cell with sense amplifier circuit 70#.

As described above, a configuration in which data bus DB1 or DB2 is driven via read gate transistor RG can suppress an RC load in the path for the current passing through the selected memory cell. Thus, the data read operation with higher speed can be implemented.

In the configuration according to the variation of the first embodiment, the read current path described in the first embodiment conceptually includes a path for the passing current through the selected memory cell (memory cell current Icell), and a path for a read drive current Irg passing through data buses DB1, DB2 and read gate transistor RG.

The read gate transistor in the non-selected column is connected to data buses DB1, DB2 in a turn-off state. Therefore, if read gate transistor RG is configured in a manner similar to FIGS. 4 to 6, or designed with a parameter as shown therein, as with the transistors connected to the read current path shown in the first embodiment, the leak current can be suppressed, and the data read margin can be secured.

Second Embodiment

In the MRAM device, data write is carried out onto the MTJ memory cell utilizing generation of the data write magnetic field. Therefore, sufficient data write current should be supplied to digit line DL and bit line BL correspondingly to the selected row and selected column respectively.

Accordingly, driver transistors for supplying the data write current, that is, digit line driver transistor 41 shown in FIGS. 1 and 7 and bit line driver transistors 51, 52, 61, and 62 should be designed to have a relatively large transistor size, in order to have sufficient current drivability. Therefore, the leak current in turn-off in these driver transistors may increase the stand-by current, and block lower power consumption in the entire MRAM device. In the configuration according to the second embodiment, suppression of the leak current in the driver transistors for data write will be described.

Figure 8:
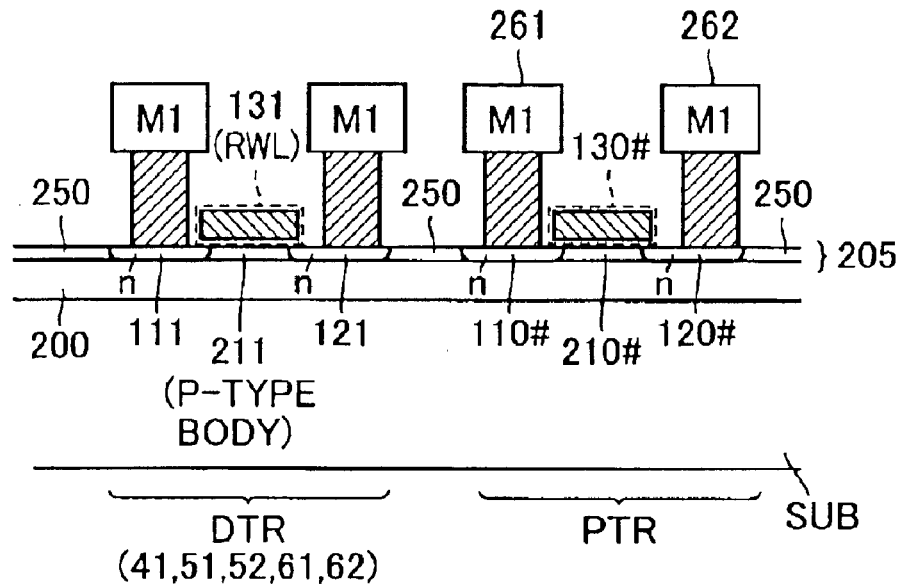
FIG. 8 is a cross-sectional view showing a configuration example of driver transistors for data write, according to a second embodiment.

FIG. 8 is a cross-sectional view showing a configuration example of the driver transistors for data write, according to the second embodiment.

Referring to FIG. 8, write driver transistor DTR is provided with the same SOI structure as described with reference to FIG. 4. It is to be noted that write driver transistor DTR is comparable to driver transistors 41, 51, 52, 61 and 62 shown in FIGS. 1 and 7.

Write driver transistor DTR is fabricated with semiconductor layer 205 formed on insulator later 200 provided on semiconductor substrate SUB, in a manner similar to access transistor ATR and peripheral circuit transistor PTR shown in FIG. 4.

Write driver transistor DTR includes impurity regions 111, 121 (n-type regions) comparable to a source and drain fabricated on semiconductor layer 205 formed on insulator layer 200, and a body region 211 (p-type). Write driver transistor DTR further includes a gate region 131 formed on the upper surface of body region 211 via a gate insulating film. Metal interconnections connected to impurity regions 111 and 121 respectively and a gate interconnection formed in gate region 131 are electrically coupled to a desired node, in order to implement a prescribed connection relation shown in FIG. 1 or FIG. 7. As in FIG. 4, regions corresponding to different. transistors on semiconductor layer 205 are electrically isolated by insulating film 250.

Thus, by fabricating a write driver transistor having a relatively large transistor size with an SOI structure, the leak current in turn-off can be suppressed. Accordingly, the stand-by current can be suppressed, and power consumption in the entire MRAM device can be lowered.

Figure 9:
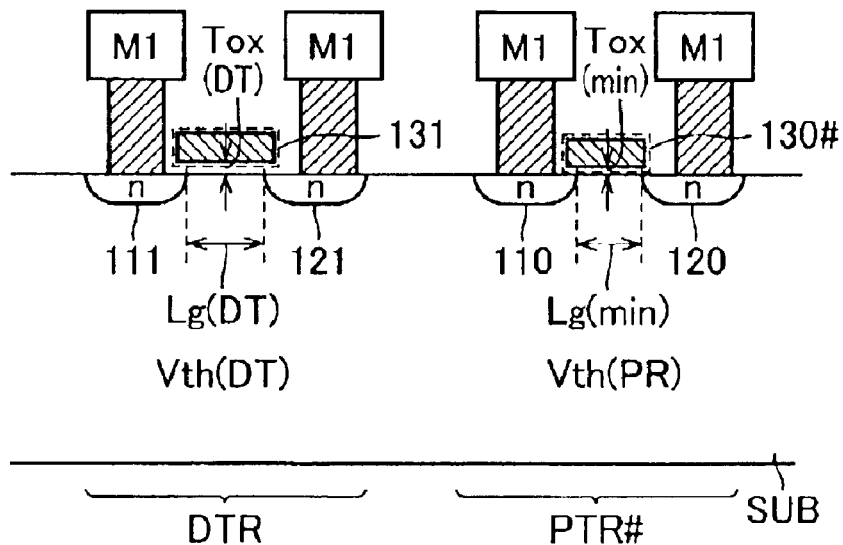
FIG. 9 is a first diagram showing a setting of a design parameter in the driver transistors for data write, according to the second embodiment.
Figure 10:
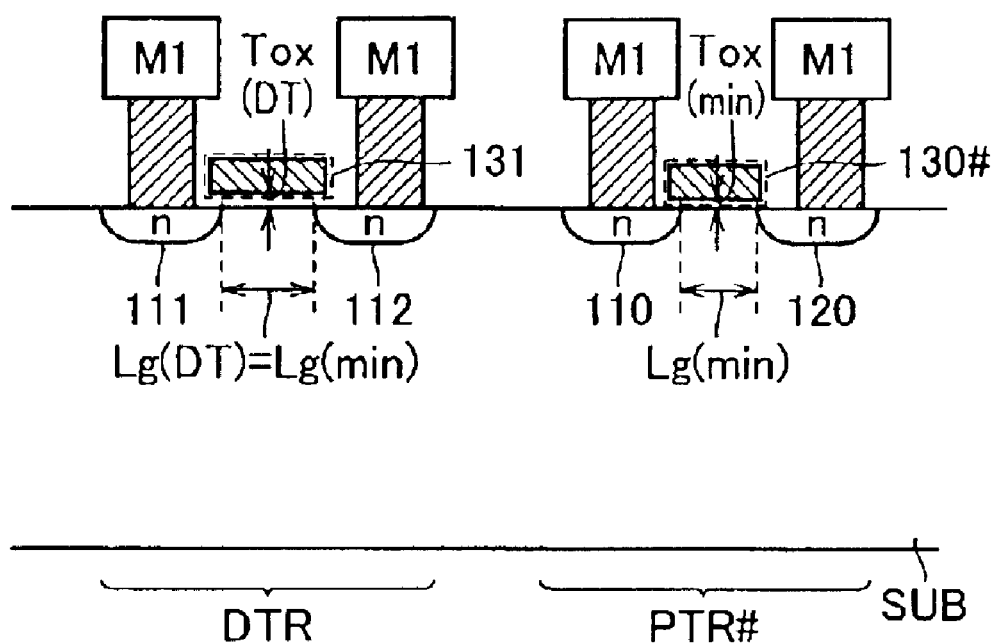
FIG. 10 is a second diagram showing a setting of the design parameter in the driver transistors for data write, according to the second embodiment.

FIGS. 9 and 10 show settings of the design parameter in the driver transistors for data write, according to the second embodiment.

Referring to FIGS. 9 and 10, a threshold voltage Vth (DT), a gate length Lg (DT), and a thickness of the gate insulating film Tox (DT) of write driver transistor DTR are also designed, considering parameters of a similar type for peripheral circuit transistor PTR# described in FIGS. 5 and 6. That is, in write driver transistor DTR as well, in order to suppress the off-leak current, not only the SOI structure shown in FIG. 8 is adopted, but also the gate length Lg (DT) is extended to suppress the channel off-leak current, and the thickness of the gate insulating film Tox (DT) is made larger to suppress the gate leak current. Therefore, in write driver transistor DTR, the gate length is designed to satisfy a relation of Lg (DT)>Lg (min), while the thickness of the gate insulating film is designed to satisfy a relation of Tox (DT)>Tox (min). In addition, designing the absolute value for the threshold voltage to satisfy a relation of Vth (DT) >Vth (PR) is also effective for suppressing the channel leak current. Consequently, the amount of current leak per a unit size of write driver transistor DTR is smaller than that of peripheral circuit transistor PTR#.

Alternatively, referring to FIG. 10, if the effect of the gate leak current produced between gate region 131 and the body region is more significant than that of the channel leak current, the total leak current can be suppressed by designing the gate length of write driver transistor DTR to attain Lg (DT)=Lg (min). In other words, as described with reference to FIG. 6, the gate length Lg (DT) of write driver transistor DTR is to be designed, considering whether the effect of the channel leak or the gate leak is more significant.

With such a parameter design, the leak current in turn-off in write driver transistors constituted with transistors of a relatively large size can be suppressed. Consequently, the stand-by current can be reduced, and power consumption in the entire MRAM device can be lowered.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A thin film magnetic memory device, comprising:
a plurality of magnetic memory cells arranged in matrix, and including a magneto-resistance element each having an electric resistance variable in accordance with magnetically written storage data;
a data line through which a read current is fed in accordance with the storage data in a selected memory cell corresponding to an address signal, among said plurality of magnetic memory cells in data read; and
a peripheral circuit for carrying out data read and data write for said selected memory cell; wherein
said peripheral circuit includes a sense amplifier circuit reading the storage data in said selected memory cell based on said read current; and
at least some of transistors electrically coupled to a current path for said read current are designed to have an amount of current leak per a unit size smaller than at least some transistors having a maximum amount of current leak per a unit size among transistors in said peripheral circuit.

2. The thin film magnetic memory device according to claim 1, wherein
said at least some of transistors electrically coupled to said current path have an absolute value for a threshold voltage higher than at least some transistors having a minimum absolute value for the threshold voltage among the transistors in said peripheral circuit.

3. The thin film magnetic memory device according to claim 1, wherein
a gate length of said at least some of transistors electrically coupled to said current path is designed such that an amount of current leak per said unit size is minimized.

4. The thin film magnetic memory device according to claim 1, wherein
said at least some of transistors electrically coupled to said current path have a thickness of a gate insulating film larger than at least some transistors having a minimum thickness of the gate insulating film among the transistors in said peripheral circuit.

5. The thin film magnetic memory device according to claim 1, wherein
said peripheral circuit further includes a decoder circuit for decoding said address signal to designate said selected memory cell, and
an amount of current leak per said unit size in transistors in said decode circuit is larger than the amount of current leak per said unit size in said at least some of transistors electrically coupled to said current path.

6. The thin film magnetic memory device according to claim 1, wherein
the peripheral circuit further includes
a data output circuit for outputting read data from said sense amplifier circuit to outside, and
a data input circuit for receiving write data to said selected memory cell, and
an amount of current leak per said unit size in transistors in said data input circuit and said data output circuit is larger than the amount of current leak per said unit size in said at least some of transistors electrically coupled to said current path.

7. The thin film magnetic memory device according to claim 1, wherein
said data line includes a plurality of bit lines provided corresponding to prescribed sections of said magnetic memory cells respectively,
each of said plurality of magnetic memory cells further includes an access transistor connected in series to said magneto-resistance element between corresponding one of said bit lines and a fixed voltage and selectively turning on, and said at least some of transistors electrically coupled to said current path include said access transistor.

8. The thin film magnetic memory device according to claim 1, wherein said data line includes a plurality of bit lines provided corresponding to prescribed sections of said magnetic memory cells respectively, and a read data line connected to said sense amplifier, said peripheral circuit further includes a plurality of select gate transistors provided between said plurality of bit lines and said read data line respectively and selectively connecting said plurality of bit lines to said read data line, and said at least some of transistors electrically coupled to said current path include said plurality of select gate transistors.

9. The thin film magnetic memory device according to claim 1, wherein said data line includes a plurality of bit lines provided corresponding to prescribed sections of said magnetic memory cells respectively, each of said plurality of magnetic memory cells further includes an access transistor connected in series to said magneto-resistance element between corresponding one of said bit lines and a fixed voltage and selectively turning on, said peripheral circuit further includes a plurality of bit line drivers provided corresponding to said plurality of bit lines respectively, each of said plurality of bit line drivers includes first and second driver transistors electrically coupled between first and second voltages and corresponding one of said bit lines respectively, each turning on and off in a complementary manner in data write and each turning off in data read, and said at least some of transistors electrically coupled to said current path include said first and second driver transistors.

10. The thin film magnetic memory device according to claim 1, wherein said data line includes a plurality of bit lines provided corresponding to prescribed sections of said magnetic memory cells respectively, each of said plurality of magnetic memory cells further includes an access transistor connected in series to said magneto-resistance element between corresponding one of said bit lines and a fixed voltage and selectively turning on, said peripheral circuit further includes a plurality of precharge transistors provided between said plurality of bit lines and a prescribed voltage respectively, and each precharging corresponding one of said bit lines to said prescribed voltage, and said at least some of transistors electrically coupled to said current path include said plurality of precharge transistors.

11. The thin film magnetic memory device according to claim 1, wherein said data line includes a plurality of bit lines provided corresponding to prescribed sections of said magnetic memory cell respectively, and a plurality of read data lines connected to said sense amplifier, and each associated in advance with a portion of said plurality of bit lines, and said peripheral circuit further includes a plurality of select gate transistors provided corresponding to said plurality of bit lines respectively, each electrically coupled between corresponding one of said bit lines and corresponding one of said read data lines, and turning on in response to said address signal.

12. The thin film magnetic memory device according to claim 11, wherein said at least some of transistors electrically coupled to said current path include said plurality of select gate transistors.

13. The thin film magnetic memory device according to claim 1, wherein said data line includes a plurality of bit lines provided corresponding to prescribed sections of said magnetic memory cells respectively, and a read data line connected to said sense amplifier, each of said plurality of magnetic memory cells further includes an access transistor connected in series to said magneto-resistance element between corresponding one of said bit lines and a fixed voltage and selectively turning on at least in said selected memory cell, a selected bit line connected to said fixed voltage via said selected memory cell among said plurality of bit lines in data read is further connected to a voltage different from said fixed voltage, said peripheral circuit includes a read gate transistor for driving said read data line with a driving force in accordance with a potential of said selected bit line, and said at least some of transistors electrically coupled to said current path include said read gate transistor.

14. A thin film magnetic memory device, comprising:

a plurality of magnetic memory cells arranged in matrix, and including a magneto-resistance element each having an electric resistance variable in accordance with magnetically written storage data;

a data line through which a read current is fed in accordance with the storage data in a selected memory cell corresponding to an address signal, among said plurality of magnetic memory cells in data read; and a peripheral circuit for carrying out data read and data write for said selected memory cell; wherein said peripheral circuit includes a sense amplifier circuit reading the storage data in said selected memory cell based on said read current; and at least some of transistors electrically coupled to a current path for said read current have an SOI structure.

15. A thin film magnetic memory device, comprising:

a plurality of magnetic memory cells arranged in matrix, and including a magneto-resistance element each having an electric resistance variable in accordance with magnetically written storage data;

a plurality of write current lines for selectively generating a data write magnetic field to be applied to a selected memory cell corresponding to an address signal, among said plurality of magnetic memory cells; and a peripheral circuit for carrying out data read and data write for said selected memory cell; wherein said peripheral circuit includes a plurality of write driver transistors provided corresponding to said plurality of write current lines respectively and supplying a data write current to corresponding one of said current write lines; and each of said write driver transistors is designed so as to have an amount of current leak per a unit size smaller than at least some transistors having a maximum amount of current leak per a unit size among transistors in said peripheral circuit.

16. The thin film magnetic memory device according to claim 15, wherein each of said write driver transistors has an absolute value for a threshold voltage higher than at least some transistors having a minimum absolute value for the threshold voltage among the transistors in said peripheral circuit.

17. The thin film magnetic memory device according to claim 15, wherein a gate length of each of said write driver transistors is designed such that an amount of current leak per said unit size is minimized.

18. The thin film magnetic memory device according to claim 15, wherein each of said write driver transistors has a thickness of a gate insulating film larger than at least some transistors having a minimum thickness of the gate insulating film among the transistors in said peripheral circuit.

19. A thin film magnetic memory device, comprising:

a plurality of magnetic memory cells arranged in matrix, and including a magneto-resistance element having an electric resistance variable in accordance with magnetically written storage data;

a plurality of write current lines for selectively generating a data write magnetic field to be applied to a selected memory cell corresponding to an address signal, among said plurality of magnetic memory cells; and a peripheral circuit for carrying out data read and data write for said selected memory cell; wherein said peripheral circuit includes a plurality of write driver transistors provided corresponding to said plurality of write current lines respectively, and supplying a data write current to corresponding one of said current write lines; and said plurality of write driver transistors have an SOI structure.

20. A thin film magnetic memory device, comprising:

a plurality of magnetic memory cells arranged in matrix, and including a magneto-resistance element each having an electric resistance variable in accordance with magnetically written storage data;

a data line through which a read current is fed in accordance with the storage data in a selected memory cell corresponding to an address signal, among said plurality of magnetic memory cells in data read; and a peripheral circuit for carrying out data read and data write for said selected memory cell; wherein said peripheral circuit includes a sense amplifier circuit reading the storage data in said selected memory cell based on said read current; and at least some of transistors electrically coupled to a current path for said read current are designed to have an amount of current leak per a unit channel width smaller that at least some transistors having a maximum amount of current leak per a unit channel width among transistors in said peripheral circuit.

21. The thin film magnetic memory device according to claim 20, wherein said at least some transistors electrically coupled to said current path have an absolute value for a threshold voltage higher that at least some transistors having a minimum absolute value for the threshold voltage among the transistors in said peripheral circuit.

22. The thin film magnetic memory device according to claim 20, wherein a gate length of said at least some of transistors electrically coupled to said current path is designed such that an amount of current leak per said unit channel width is minimized.

23. The thin film magnetic memory device according to claim 20, wherein said at least some of transistors electrically coupled to said current path have a thickness of a gate insulating film larger that at least some transistors having a minimum thickness of the gate insulating film among the transistors in said peripheral circuit.

* * * * *